US 7,952,856 B2

(12) United States Patent
Otsuka et al.

(10) Patent No.: US 7,952,856 B2
(45) Date of Patent: May 31, 2011

(54) POWER CONTROL UNIT AND HYBRID VEHICLE COMPRISING SAME

(75) Inventors: Hiroshi Otsuka, Utsunomiya (JP);
Osamu Saito, Shioya-gun (JP); Atsushi Amano, Utsunomiya (JP)

(73) Assignee: Honda Motor Co., Ltd., Tokyo (JP)

( * ) Notice: Subject to any disclaimer, the term of this patent is extended or adjusted under 35 U.S.C. 154(b) by 183 days.

(21) Appl. No.: 12/474,997

(22) Filed: May 29, 2009

(65) Prior Publication Data
US 2009/0294195 A1 Dec. 3, 2009

(30) Foreign Application Priority Data

Jun. 2, 2008 (JP) ................................. 2008-145009
Jun. 2, 2008 (JP) ................................. 2008-145011

(51) Int. Cl.
*H02B 1/21* (2006.01)
*B60W 10/08* (2006.01)
*H05K 7/00* (2006.01)

(52) U.S. Cl. ..................... 361/624; 361/622; 180/65.275
(58) Field of Classification Search .................. 361/622, 361/624, 807; 180/65.275
See application file for complete search history.

(56) References Cited

U.S. PATENT DOCUMENTS

| 6,072,240 | A * | 6/2000 | Kimura et al. ................. 257/735 |
| 6,166,937 | A * | 12/2000 | Yamamura et al. ............. 363/141 |
| 6,414,867 | B2 * | 7/2002 | Suzuki et al. .................. 363/141 |
| 6,621,701 | B2 * | 9/2003 | Tamba et al. .................. 361/699 |
| 7,151,671 | B2 * | 12/2006 | Hyodo .......................... 361/717 |
| 7,508,668 | B2 * | 3/2009 | Harada et al. ................. 361/699 |
| 7,542,318 | B2 * | 6/2009 | Otsuka et al. ................. 363/178 |
| 7,646,606 | B2 * | 1/2010 | Rytka et al. .................. 361/704 |
| 7,760,503 | B2 * | 7/2010 | Aoki et al. .................... 361/699 |
| 7,773,381 | B2 * | 8/2010 | Okumura et al. .............. 361/715 |
| 2003/0067749 | A1 * | 4/2003 | Tamba et al. .................. 361/699 |
| 2005/0223727 | A1 * | 10/2005 | Funahashi et al. ............. 62/228.4 |
| 2007/0002594 | A1 * | 1/2007 | Otsuka et al. ................. 363/37 |

FOREIGN PATENT DOCUMENTS

| JP | 06-021323 A | 1/1994 |
| JP | 11-225485 A | 8/1999 |
| JP | 2001-274322 A | 10/2001 |
| JP | 2001-332688 A | 11/2001 |
| JP | 2002-094262 A | 3/2002 |
| JP | 2002-359333 A | 12/2002 |
| JP | 2005-191233 A | 7/2005 |
| JP | 2006-294973 A | 10/2006 |
| JP | 2007-099121 A | 4/2007 |
| JP | 2007-335858 A | 12/2007 |

* cited by examiner

*Primary Examiner* — Anatoly Vortman
(74) *Attorney, Agent, or Firm* — Arent Fox LLP

(57) ABSTRACT

A power control unit which comprises a plurality of semiconductor elements including a plurality of high-potential side semiconductor elements and a plurality of low-potential side semiconductor elements, and each having a first face and a second face, a collector terminal or an emitter terminal provided on the first face, or an emitter terminal and a gate terminal provided on the first face; a plurality of bus bars electrically connected with at least one of the semiconductor elements, and forming a power module together with the semiconductor elements; a terminal block having signal lines and a resin mold which supports the signal lines; and an engaging portion provided on at least one of the bus bars, and engaging with a portion of the terminal block, and also supporting the terminal block, the signal lines directly connected with the gate electrodes through the engaging portion.

5 Claims, 20 Drawing Sheets

POWER CONTROL UNIT AND HYBRID VEHICLE COMPRISING SAME

BACKGROUND OF THE INVENTION

1. Field of the Invention

The present invention relates to a power control unit and to a hybrid vehicle comprising such a power control unit.

The present invention claims priority on Japanese Patent Application No. 2008-145009, filed on Jun. 2, 2008, and Japanese Patent Application No. 2008-145011, filed on Jun. 2, 2008, the contents of which are incorporated herein by reference.

2. Description of Related Art

In a semiconductor module comprising a conventional semiconductor chip, when connecting a signal line of the semiconductor module to the semiconductor chip, they are connected by a fine aluminum wire with solder by using wire bonding technology (Japanese Unexamined Patent Application, First Publication No. 2006-294973).

However, in such a conventional semiconductor module, connections employ wire bonding, so there are problems in that a large amount of space is necessary for wire distribution and a large occupied area must be secured for the semiconductor module.

In addition, the conduction resistance increases due to the fact that a wire is used, so there is a problem in that electrical losses increase. Also, there are problems in that much manufacturing time is required and manufacturing costs mount.

In power control units, the semiconductor elements mounted on electrode plate, and the negative electrode-side wiring conductors and positive electrode-side wiring conductors rising from the semiconductor elements are arranged in opposition. In the opposed arranged negative electrode-side wiring conductors and positive electrode-side wiring conductors, currents flow in opposite directions. Thereby, the parasitic inductance can be reduced by the mutual inductance which counteracts magnetic fluxes by the oppositely-directed magnetic fields arising from these currents (Japanese Unexamined Patent Application, First Publication No. 2005-191233).

However, in the above-described conventional power control unit, sufficient counteracting effect of the magnetic fluxes cannot be obtained only by the mutual inductance which counteracts the magnetic fluxes by the oppositely-directed magnetic fields arising from the opposed arranged negative electrode-side wiring conductors and positive electrode-side wiring conductors. Thereby, there is a problem in that such a configuration cannot be applied to a large-capacity power control unit.

SUMMARY OF THE INVENTION

Hence an object of the present invention is to provide a power control unit which can be reduced in size, the conduction loss of which can be decreased compared with wiring bonding, and which can be manufactured in a short length of time.

Also, a further object of the present invention is to provide a power control unit which can maximize the reduction effect of inductance and can reduce surge voltages and inverter switching losses, and a hybrid vehicle comprising such a power control unit.

An aspect of the present invention is a power control unit, which comprises a plurality of semiconductor elements including a plurality of high-potential side semiconductor elements and a plurality of low-potential side semiconductor elements, and each having a first face and a second face, a collector terminal or an emitter terminal provided on the first face, or an emitter terminal and a gate terminal provided on the first face; a plurality of bus bars electrically connected with at least one of the semiconductor elements, and forming a power module together with the semiconductor elements; a terminal block having signal lines and a resin mold which supports the signal lines; and an engaging portion provided on at least one of the bus bars, and engaging with a portion of the terminal block, and also supporting the terminal block, the signal lines of the terminal block directly connected with the gate electrodes of the semiconductor elements through the engaging portion.

In one example of this aspect, the terminal block has a flange portion and a protruding portion, in which the flange portion is supported by the bus bars, and the protruding portion is protruded from one face of the flange portion; and the engaging portion has an opening portion and a supporting portion, in which the opening portion has an opening into which the protruding portion of the terminal block is inserted, and the supporting portion surrounds the opening and supports the flange portion.

Further, in one example of this aspect, the bus bars further have a power supply bus bar electrically connected with the first face of each of the high-potential side semiconductor elements; a plurality of AC output bus bars electrically connected with the second face of the high-potential side semiconductor elements respectively, and electrically connected with the first face of the low-potential side semiconductor elements respectively; and a ground bus bar electrically connected with the second face of each of the low-potential side semiconductor elements respectively, wherein the power supply bus bar has a power supply plate portion and a power supply erect portion, in which the power supply plate portion is substantially parallel to a reference face comprising the arrangement direction of the semiconductor elements, and the power supply erect portion along a direction intersecting the reference face; the AC output bus bars have an output plate portion which is substantially parallel to the reference face and an output erect portion along a direction intersecting the reference face; the ground bus bar has a ground plate portion which is substantially parallel to the reference face and a ground erect portion along a direction intersecting the reference face; and the power supply plate portion, the output plate portions, and the ground plate portion are stacked together with an insulating material therebetween.

Further, in one example of this aspect, the power supply plate portion and the ground plate portion are mutually adjacent.

Another aspect of the present invention provides a hybrid vehicle which comprises an engine; an electric generator driven by a mechanical output of the engine; a battery charged by an electrical output of the electric generator; a motor driven by at least one of a discharge output of the battery and the electrical output; and a power control unit according to the present invention, wherein a power module has a first power module which controls the motor and a second power module which controls the electric generator; the first power module and the second power module are arranged on the same base; and the first power module and the second power module have in common at least one of the power supply plate and the ground plate.

DETAILED DESCRIPTION OF THE INVENTION

Next, embodiments of the present invention are explained based on the drawings.

Figure 1:
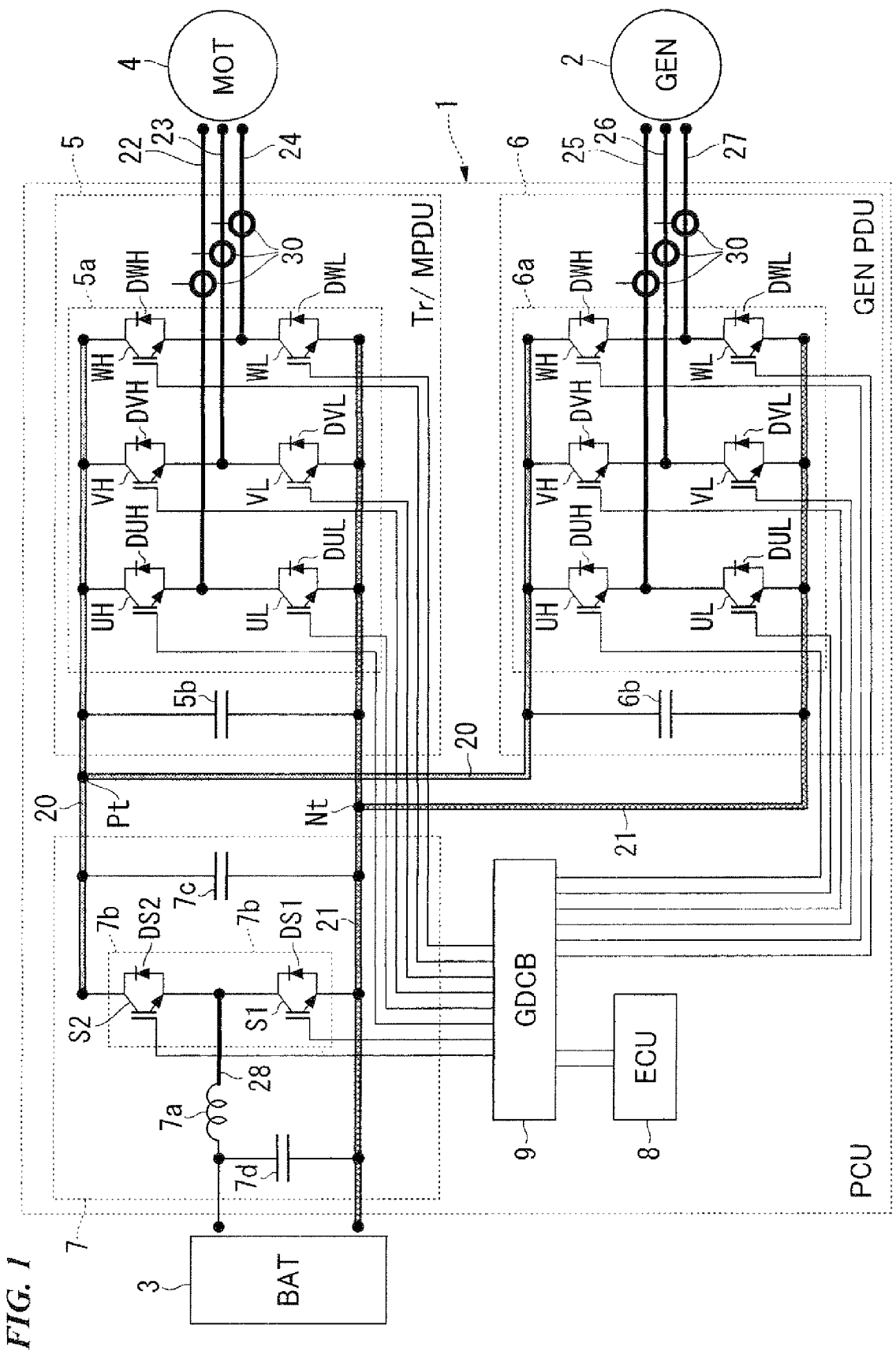
FIG. 1 shows a circuit of an embodiment of the present invention.

FIG. 1 shows a circuit configuration comprising a power control unit (PCU) 1 for a hybrid vehicle. This hybrid vehicle includes an engine (not shown), an electric generator (GEN) 2 which is driven by the mechanical output of the engine, a high-voltage battery (BAT) 3 which is charged by the electrical power output of the electric generator 2, and a motor (MOT) 4 which drives drive wheels (not shown) using at least one of the discharge output of the battery 3 and the electric power output of the electric generator 2.

The power control unit 1 comprises a first inverter (Tr/M PDU) 5 and a second inverter (GEN PDU) 6. The first inverter 5 drives the motor 4 via a converter 7 which functions as a voltage step-up circuit using electric power supplied from the battery 3, and also supplies electric power to the battery 3 via the converter 7 which functions as a voltage step-down circuit when the motor 4 is regenerated. The second inverter 6 supplies electric power generated by the electric generator 2 to the battery 3 via the converter 7 which functions as a voltage step-down circuit, or drives the motor 4 using electric power generated by the electric generator 2.

The converter 7, first inverter 5, and second inverter 6 are driven and controlled via a gate driving board (GDCB) 9 by control instructions from a control board (ECU) 8.

The first inverter 5 is for example a pulse-width modulation (PWM) inverter employing pulse-width modulation, and includes a bridge circuit 5a employing a plurality of bridge-connected transistor switching elements (for example, IGBT (Insulated Gate Bipolar Transistors)) and a smoothing capacitor 5b. The first inverter 5 is connected to the motor 4 and the converter 7. The converter 7 is a voltage-conversion device provided on the input side of the first inverter 5, and comprises a reactor 7a and a chopper circuit 7b employing two transistor switching elements (for example, IGBT (Insulated Gate Bipolar Transistors)). A secondary smoothing capacitor 7c is connected in parallel on the downstream side of the chopper circuit 7b, and a primary smoothing capacitor 7d is connected in parallel on the upstream side of the reactor 7a.

The second inverter 6, configured similarly to the first inverter 5, is connected to the positive electrode-side terminal Pt and the negative electrode-side terminal Nt between the converter 7 and the first inverter 5. The electric generator 2 is connected to this second inverter 6. Similar to the first inverter 5, the second inverter 6 is a PWM inverter employing pulse-width modulation, and includes a bridge circuit 6a employing a plurality of bridge-connected transistor switching elements and a smoothing capacitor 6b. The electric generator 2 and the converter 7 are connected to the second inverter 6. The second inverter 6 uses the output voltage of the electric generator 2 to charge the battery 3 in which the output voltage was stepped down by the converter 7, or drives the motor 4 through the first inverter 5.

The first inverter 5 and second inverter 6 include bridge circuits 5a, 6a and smoothing capacitors 5b, 6b. The bridge circuits 5a, 6a include a pair of high-side and low-side U-phase transistors UH, UL, a pair of high-side and low-side V-phase transistors VH, VL, and a pair of high-side and low-side W-phase transistors WH, WL, in which the three pairs of transistors are bridge-connected. The high-side U-phase transistor UH, high-side V-phase transistor VH, and high-side W-phase transistor WH correspond to high-potential side semiconductor elements. The low-side U-phase transistor UL, low-side V-phase transistor VL, and low-side W-phase transistor WL correspond to low-potential side semiconductor elements. Each of the transistors UH, VH, WH connected to the positive electrode-side terminal Pt of the converter 7 to forms a high-side arm. Each of the transistors UL, VL, WL connected to the negative electrode-side terminal Nt of the converter 7 to forms a low-side arm. Each pair of the transistors UH and UL, VH and VL, and WH and WL are connected in series to the converter 7. Diodes DUH, DUL, DVH, DVL, DWH, DWL are connected across the collectors and emitters of the transistors UH, UL, VH, VL, WH, WL respectively, such that the forward direction is from the emitter toward the collector.

The reactor 7a of the converter 7 has one end (a first end portion) connected to the battery 3 and to which the battery voltage is applied, and another end (a second end portion) to which a first transistor S1 and second transistor S2 are connected, in which the first transistor S1 is first switching element and the second transistor S2 is second switching element. The chopper circuit 7b includes the first transistor S1 and second transistor S2. Diodes DS1 and DS2 are connected across the collectors and emitters of the transistors S1 and S2 respectively, such that the forward direction is from the emitter toward the collector.

The one end of the reactor 7a (the first end portion) is connected to the positive electrode-side terminal of the battery 3, and the another end of the reactor 7a (the second end portion) is connected to the collector of the first transistor S1 and the emitter of the second transistor S2. The emitter of the first transistor S1 is connected to the negative electrode-side terminal of the battery 3 and to the negative electrode-side terminal Nt of the converter 7. The collector of the second transistor S2 is connected to the positive electrode-side terminal Pt of the converter 7.

Here, a POut bus bar 20 includes the bus between the transistor S2 of the converter 7 and the transistor WH of the first inverter 5, and the bus between the positive electrode-side terminal Pt of the first inverter 5 (converter 7) and the transistor WH of the second inverter 6, in which the two buses are connected to each other. Also, a N bus bar 21 includes the bus between the transistor S1 of the converter 7 and the transistor WL of the first inverter 5, and the bus between the negative electrode-side terminal Nt of the first inverter 5 (converter 7) and the transistor WL of the second inverter 6, in which the two buses are connected to each other.

The three buses connected to the coils of the U, V, and W phases of the motor 4 from the first inverter 5 form the Out bus TrU 22, the Out bus TrV 23, and the Out bus TrW 24. The three buses connected to the coils of the U, V, and W phases of the electric generator 2 from the second inverter 6 form the Out bus GENU 25, the Out bus GENV 26, and the Out bus GENW 27. The bus connected between the reactor 7a and the first transistor S1 and second transistor S2 of the converter 7 forms the PIN bus bar 28.

Current sensors 30 which send signals to the control board 8 are connected to each of the Out bus TrU 22, the Out bus TrV 23, the Out bus TrW 24, the Out bus GENU 25, the Out bus GENV 26, and the Out bus GENW 27 respectively. Also, signal lines from the gate driving board 9 are connected to the gates of each of the transistors of the first inverter 5, second inverter 6, and converter 7.

Figure 2:
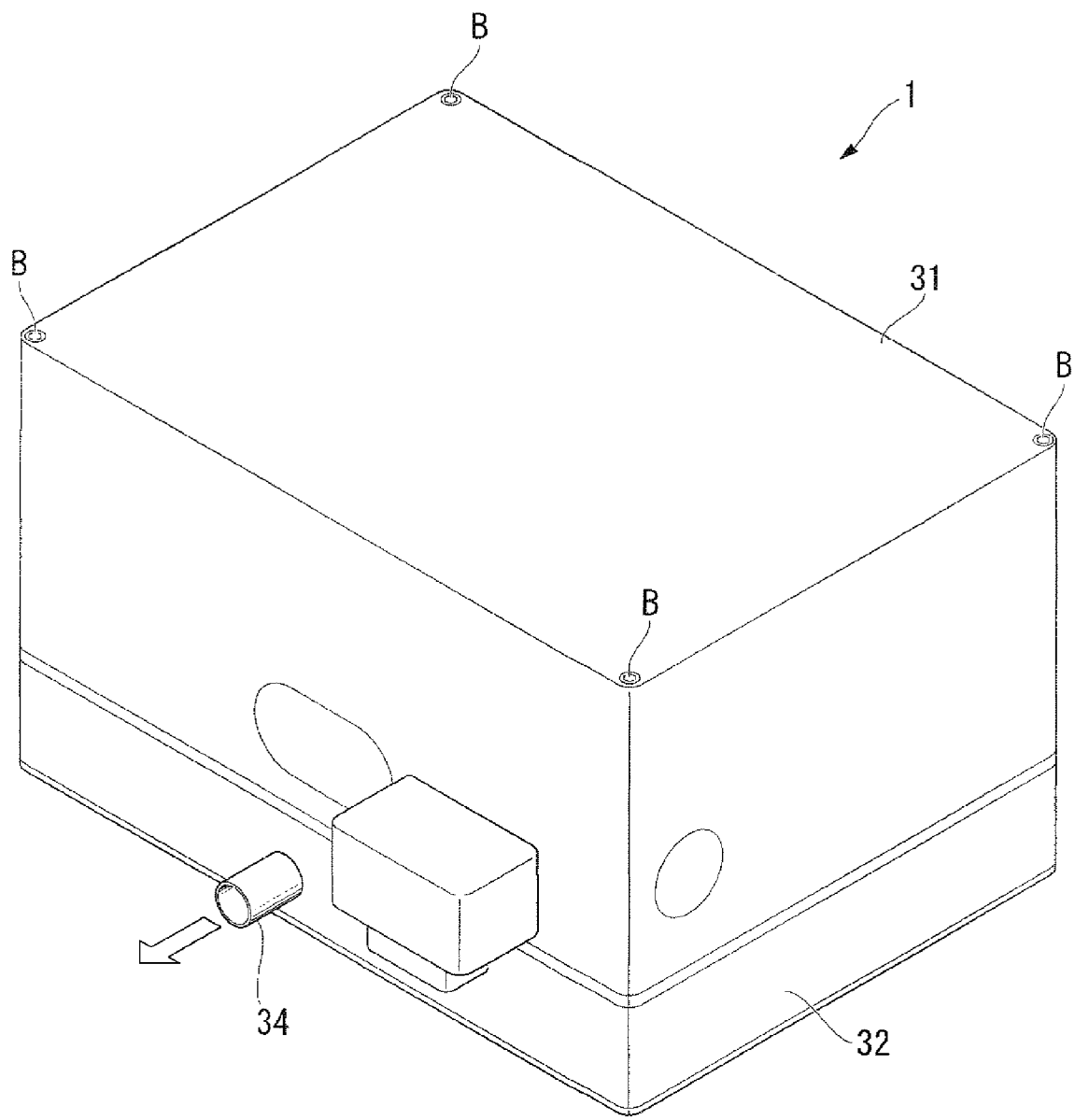
FIG. 2 is a perspective view of a power control unit of the present invention.

FIG. 2 through FIG. 10 show the hardware configuration of the power control unit 1. The power control unit 1 is for example mounted in the engine compartment of a hybrid vehicle. As shown in FIG. 2, an aluminum die-cast unit case 31 is provided in the upper portion of the power control unit 1 to cover the entire unit, and a water jacket 32 is provided in the lower portion of the power control unit 1. The opening portion of the unit case 31 and the periphery of the water jacket 32 are brought together enclosing a base frame 50, described below, and the unit case 31 and the water jacket 32 are fixed by bolts B. A coolant inlet 33 is provided in the water jacket 32 (see FIG. 5), and a coolant outlet 34 is provided in the front face of the water jacket 32. This inlet 33 and outlet 34 are connected to the equipment such as a pump of a coolant device CO.

Figure 3:
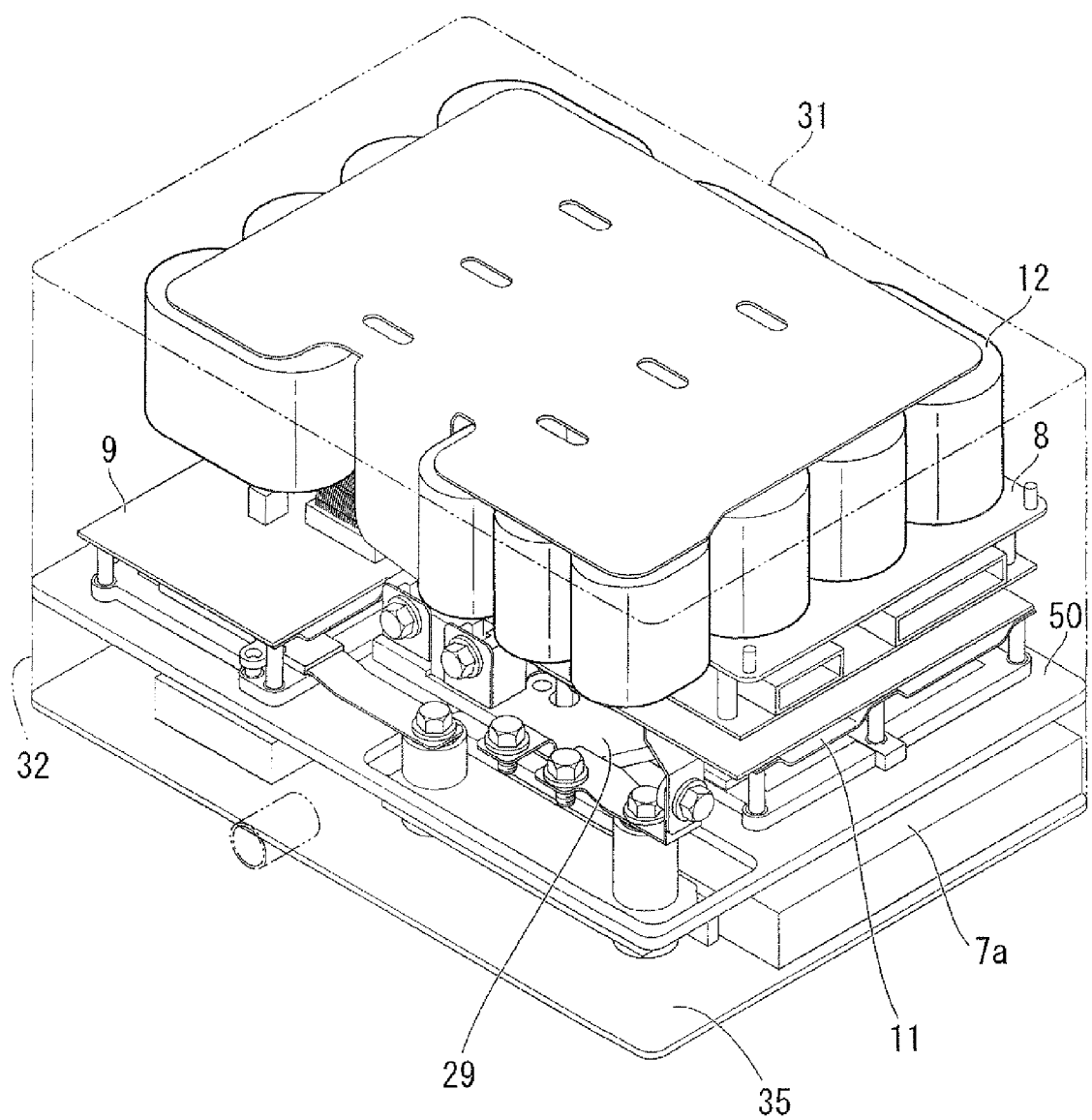
FIG. 3 is a perspective view showing the internal construction in FIG. 2.

FIG. 3 shows the overall configuration, with the unit case 31 and water jacket 32 indicated by dot-dash lines. As shown in FIG. 3, within the unit case 31 are arranged, in order from below, the reactor 7a, the water jacket 32, the base frame 50 on which are fixed seven power modules 40a to 40g (see FIG. 6), a bus bar plate component 29 which integrates a plurality of bus bars 20 to 28 (see FIG. 1), a shield plate 11, the gate driving board 9, the control board 8, and a capacitor unit 12.

Figure 4:
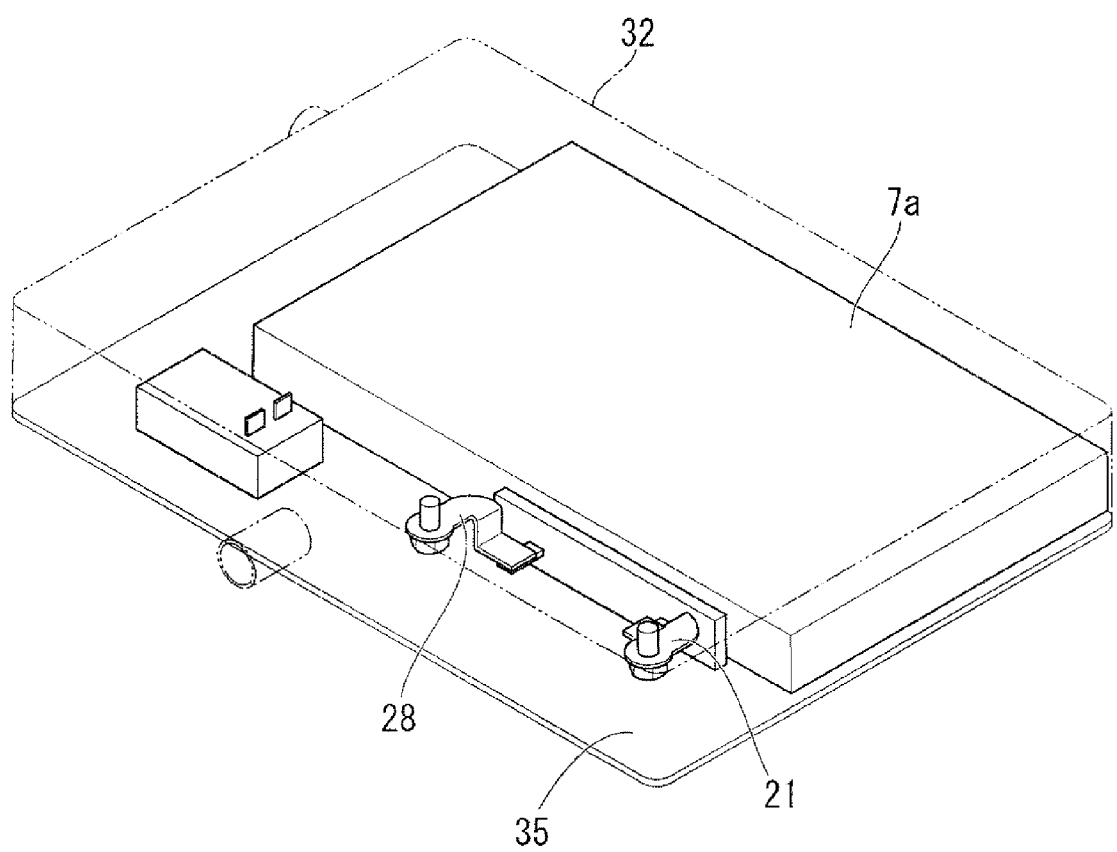
FIG. 4 is a perspective view of a reactor.

As shown in FIG. 4, the reactor 7a is installed on the board 35, and above this reactor 7a is arranged an aluminum water jacket 32.

Figure 5:
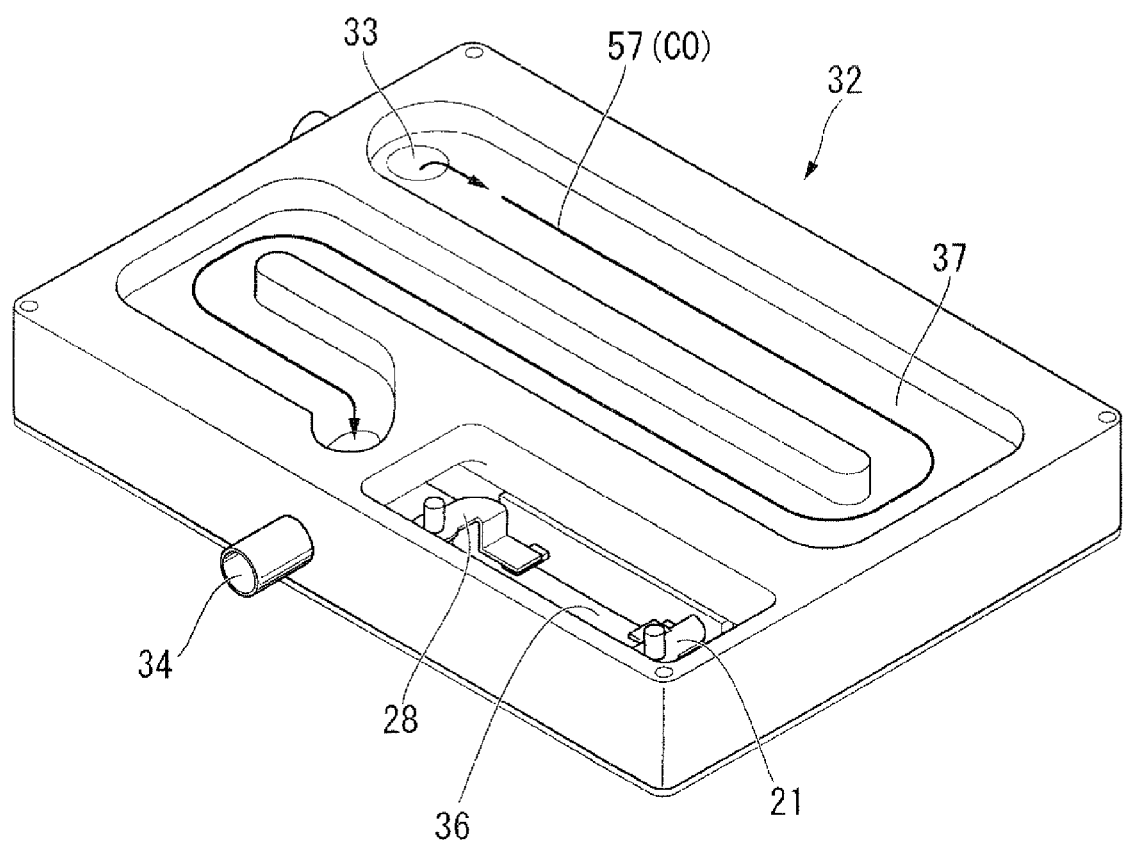
FIG. 5 is a perspective view in which a water jacket is placed on the reactor.

As shown in FIG. 5, a depressed portion 36 is formed in a corner portion of the upper face of the water jacket 32. Terminal for the PIN bus bar 28 extending from the reactor 7a and terminal for the N bus bar 21 extending from the reactor 7a are drawn into the depressed portion 36. A meandering groove 37 is formed in the upper face of the water jacket 32 excepting the depressed portion 36. The groove 37 forms a path which first curves in a U shape, then bends forward before the depressed portion 36. The inlet 33 is formed in the bottom at the start of the path, and the end of the path is communicated with the outlet 34. The meandering groove 37 of the water jacket 32 is formed so as to correspond to and receive the heat sinks 41 (see FIG. 7) of the power modules 40a to 40g (see FIG. 6) mounted on the base frame 50.

Figure 6:
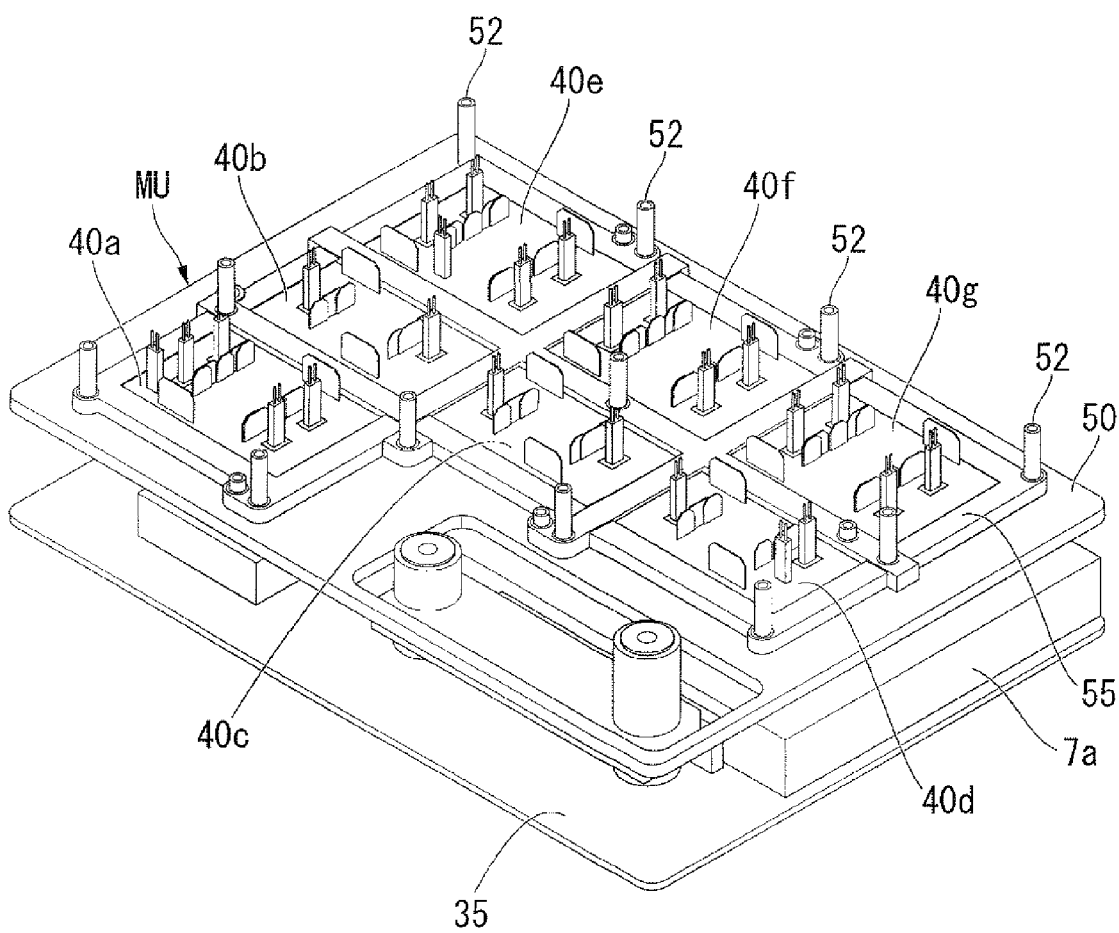
FIG. 6 is a perspective view in which a module unit is placed on the water jacket.
Figure 7:
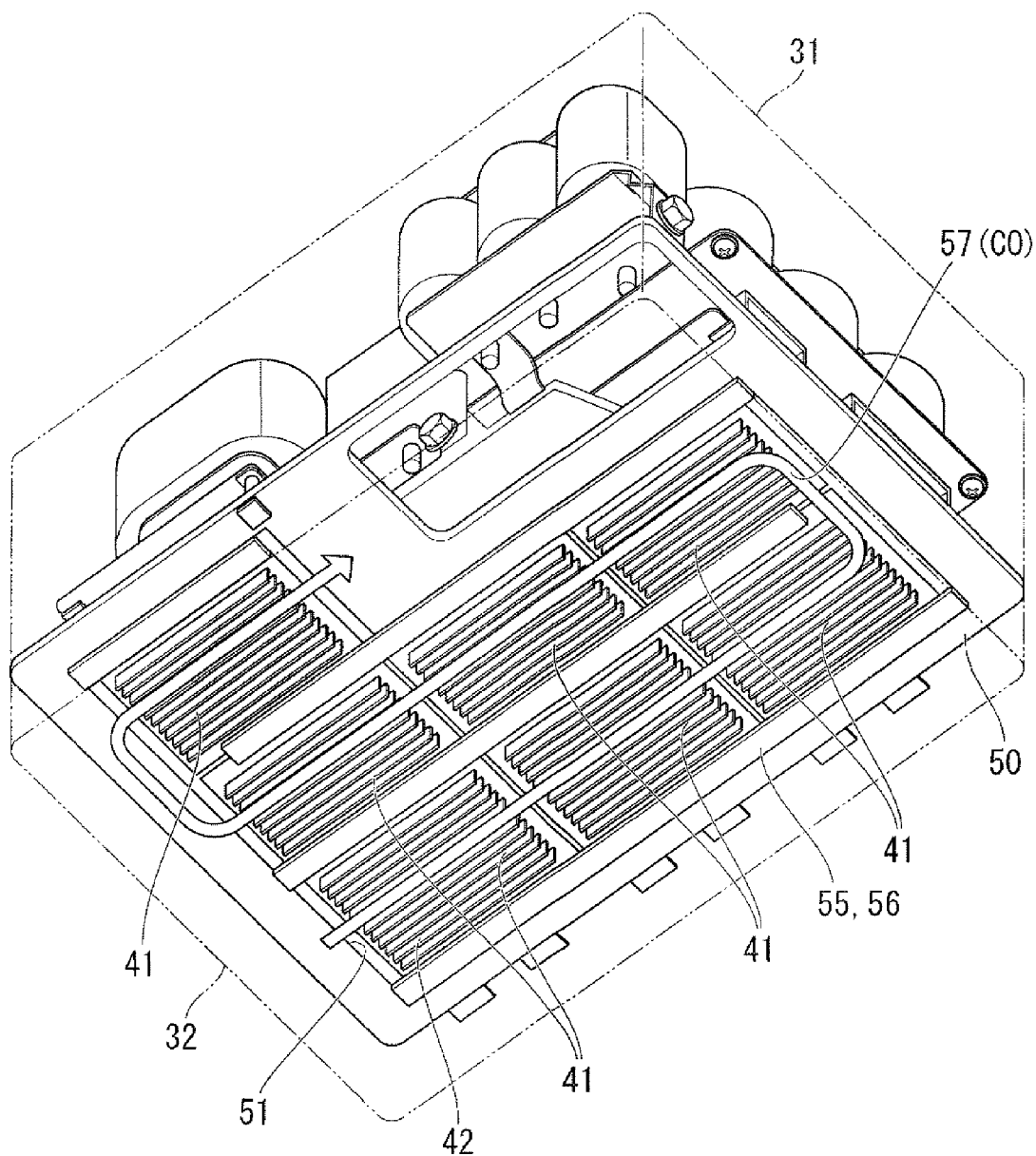
FIG. 7 is a perspective view, seen from below, in which the water jacket is removed from FIG. 3.

FIG. 6 is a perspective view of the power modules 40a to 40g mounted in the base frame 50, and FIG. 7 is a perspective view of the base frame 50 seen from below.

As shown in FIG. 6 and FIG. 7, the aluminum die-cast base frame 50 is arranged above the water jacket 32. Seven opening portions 51 are formed in this base frame 50. The seven power modules 40a to 40g are fixed with a resin in the opening portions 51, to form a modular unit MU. Here, a resin portion 55 is formed by the resin which fixes the power modules 40a to 40g in the base frame 50. This resin portion 55 forms vertical walls 56, demarcating and forming a coolant path 57 together with the water jacket 32. By means of this resin portion 55, a portion of a coolant device CO which enables direct contact of a coolant with the fins 42 of the heat sinks 41 is formed.

Each of the power modules 40a to 40g is formed integrally with a heat sink 41. In the power module 40a are mounted the first transistor S1 and second transistor S2 of the converter 7 in the above-described circuit configuration. In the power module 40b are mounted a pair of the high-side transistor UH and the low-side transistor UL of the second inverter 6. In the power module 40c are mounted a pair of high-side transistor VH and the low-side transistor VL of the second inverter 6. In the power module 40d are mounted a pair of high-side transistor WH and the low-side transistor WL of the second inverter 6. In the power module 40e are mounted a pair of the high-side transistor UH and the low-side transistor UL of the first inverter 5. In the power module 40f are mounted a pair of the high-side transistor VH and the low-side transistor VL of the first inverter 5. In the power module 40g are mounted a pair of the high-side transistor WH and the low-side transistor WL of the first inverter 5. The one power module 40a, the three power modules 40b, 40c, 40d, and the three power modules 40e, 40f, 40g are arranged in order from the front side toward the rear side in FIG. 6. As shown in FIG. 7, the fins 42 of the heat sinks 41 have heat-dissipating faces arranged in the direction along the coolant path 57 in which coolant flows.

Figure 8:
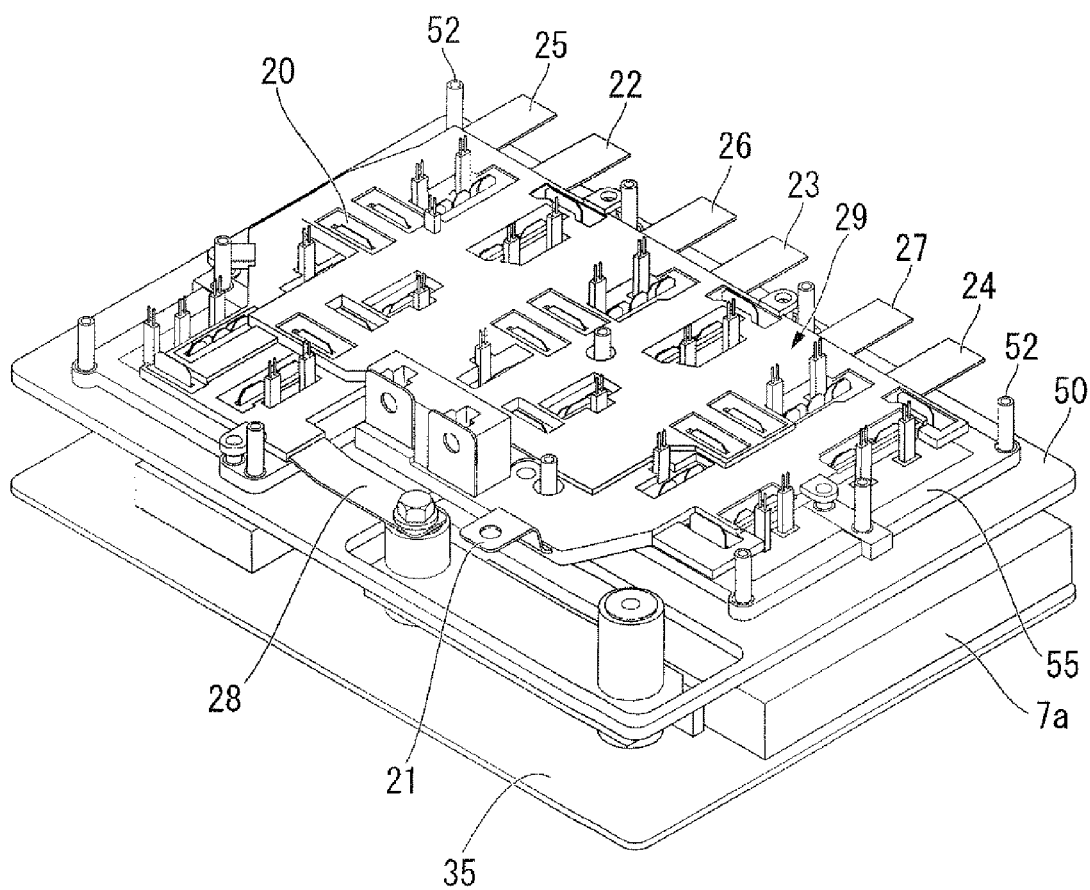
FIG. 8 is a perspective view in which a bus bar plate component is placed on the module unit.
Figure 9:
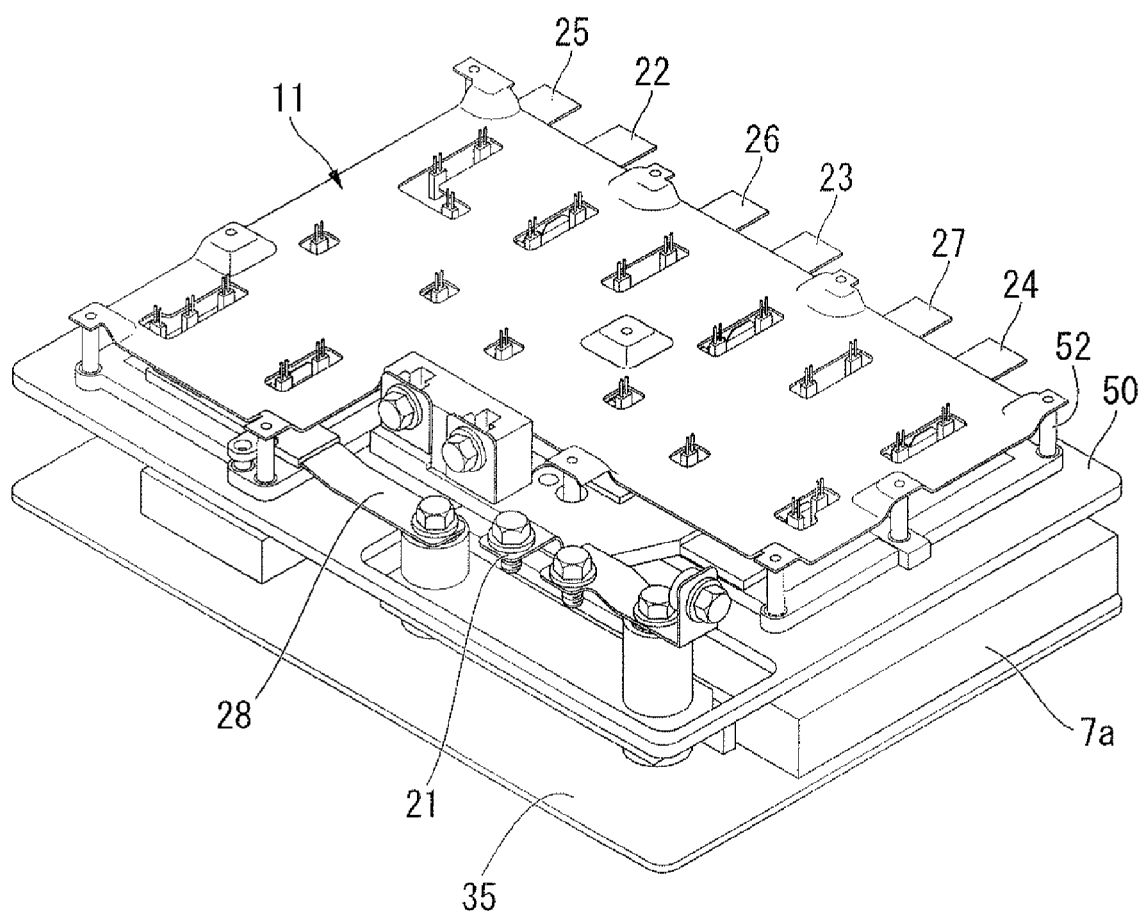
FIG. 9 is a perspective view in which a shield plate is placed on the module unit.

As shown in FIG. 8, the bus bar plate component 29 is arranged on the upper portion of the base frame 50. In the bus bar plate component 29, the plate-shape POut bus bar 20, N bus bar 21, three Out buses Tr (U, V, W) 22, 23, 24, three Out buses GENT (U, V W) 25, 26, 27, and PIN bus bar 28 are integrated in a resin mold. As shown in FIG. 9, on the upper portion of this bus bar plate component 29 is further arranged the shield plate 11 so as to cover the bus bar plate component 29.

Figure 10:
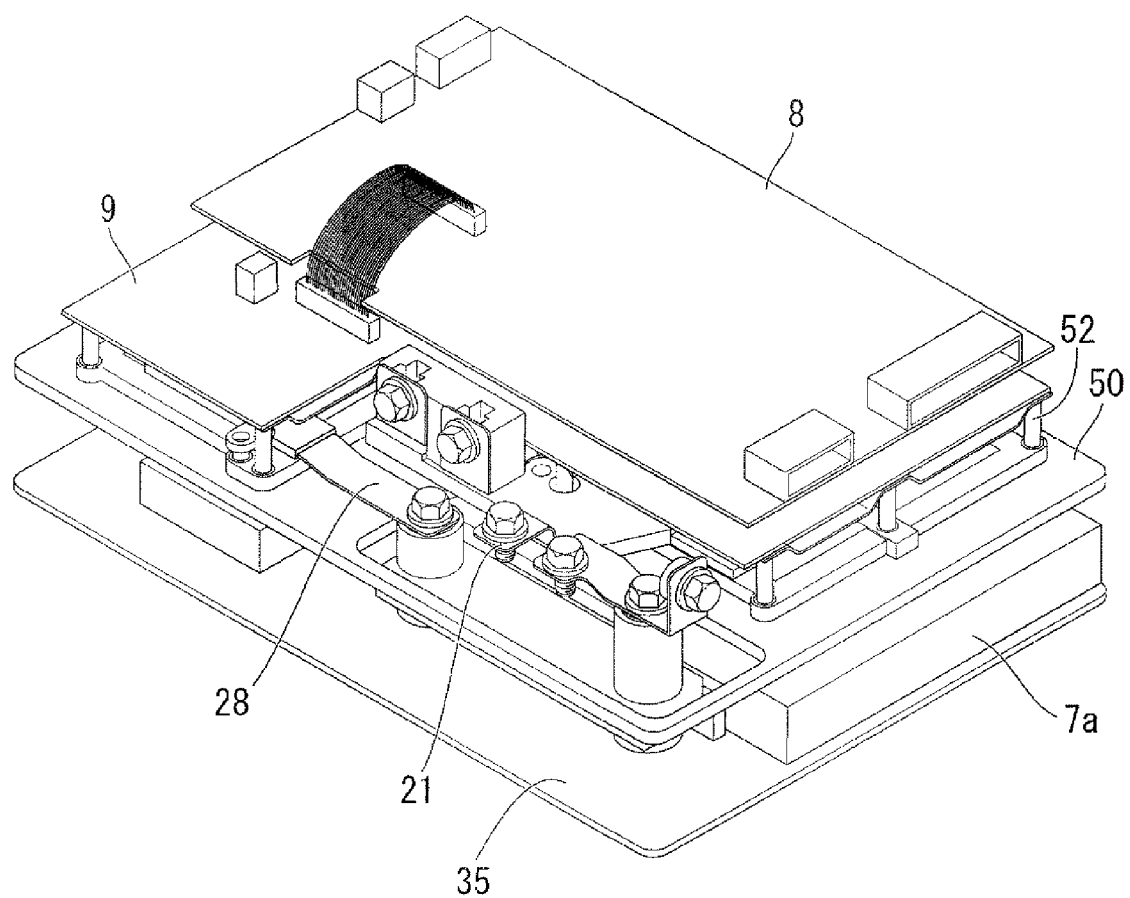
FIG. 10 is a perspective view in which a gate driving board and control board are placed on the shield plate.

As shown in FIG. 10, the gate driving board 9 is arranged above the shield plate 11 (see FIG. 9) and is fixed to fixing bosses 52 protruding on the base frame 50 so as to enclose the shield plate 11 (see FIG. 9). The control board 8 is arranged above the gate driving board 9. Here, the control board 8 is fixed on the side of the unit case 31 (see FIG. 3).

Also, as shown in FIG. 3, a capacitor unit 12 which is mounted inside the unit case 31 is arranged above the control board 8. This capacitor unit 12 incorporates the smoothing capacitor 5b of the first inverter 5, smoothing capacitor 6b of the second inverter 6, and primary smoothing capacitor 7d and secondary smoothing capacitor 7c of the converter 7 into one unit. And the capacitor unit 12 is fixed within the unit case 31 by potting using resin.

Figure 11:
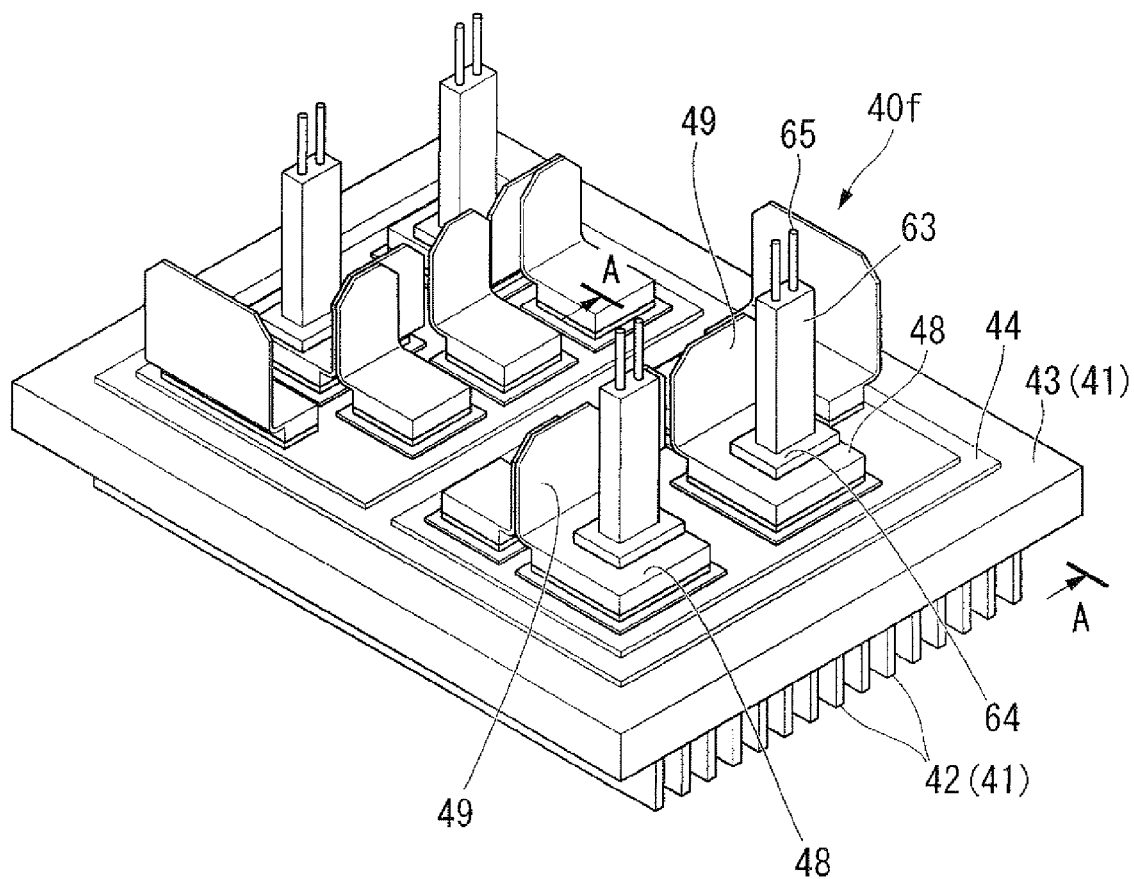
FIG. 11 is a perspective view of a power module.
Figure 12:
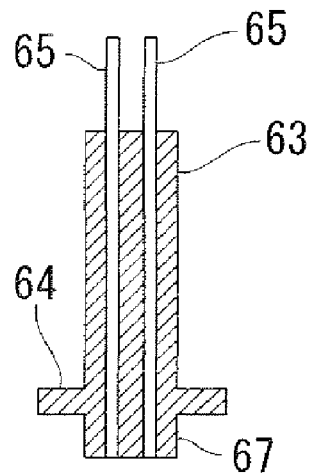
FIG. 12 is a cross-sectional view showing FIG. 14 in an exploded state.
Figure 12:
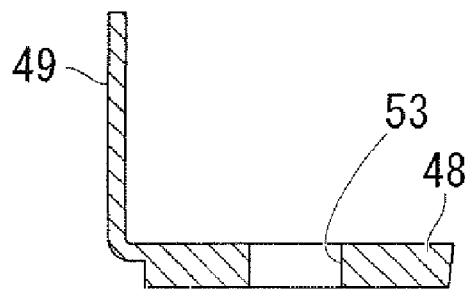
Figure 12:
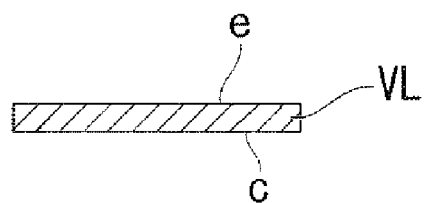
Figure 12:
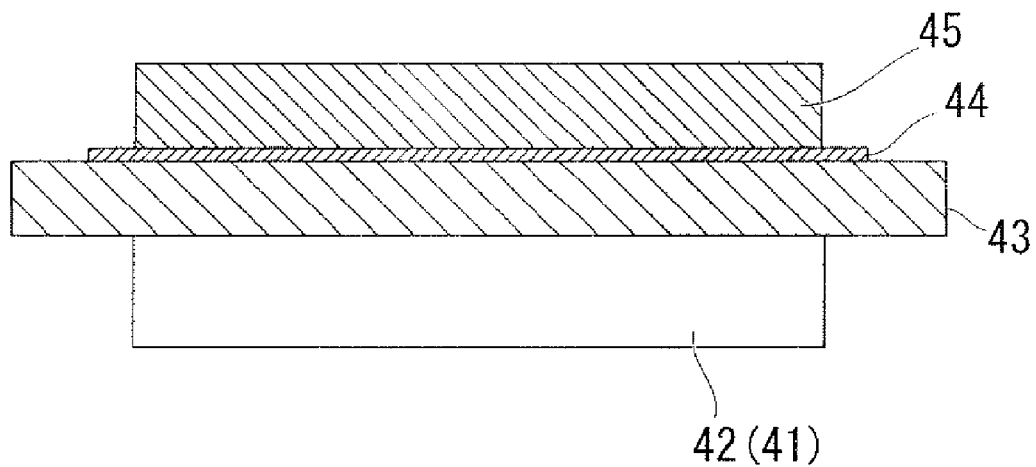
Figure 13:
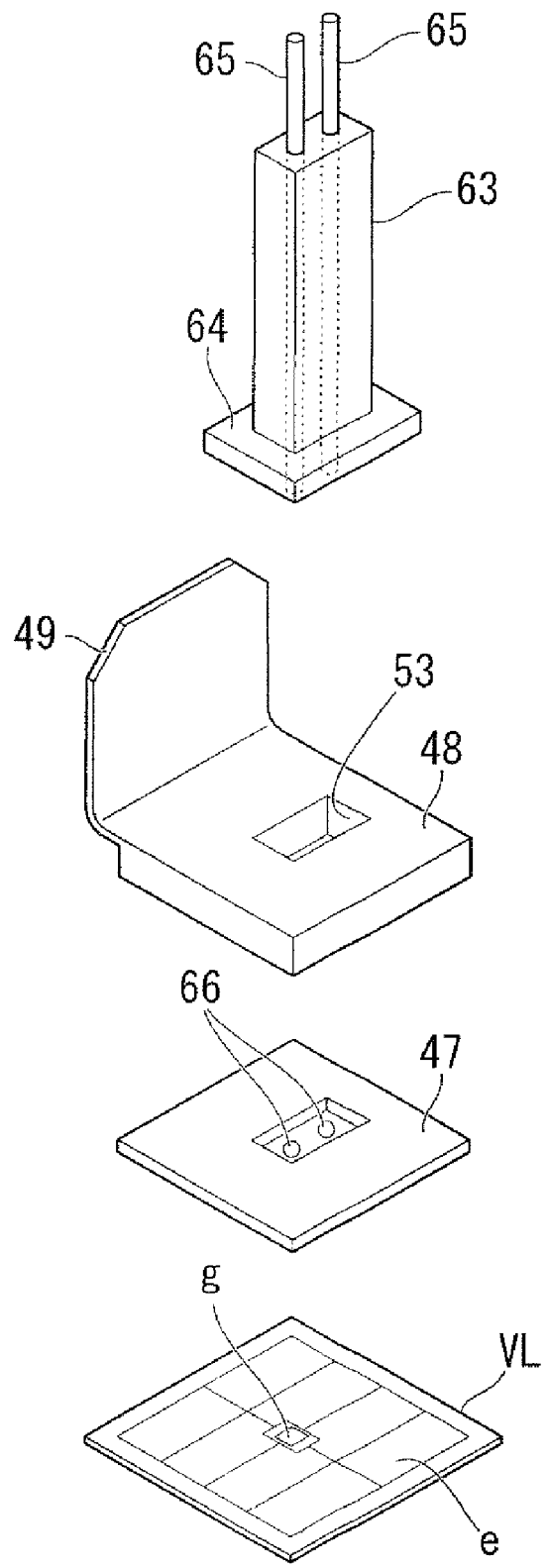
FIG. 13 is an exploded perspective view of principal portions of FIG. 12.
Figure 14:
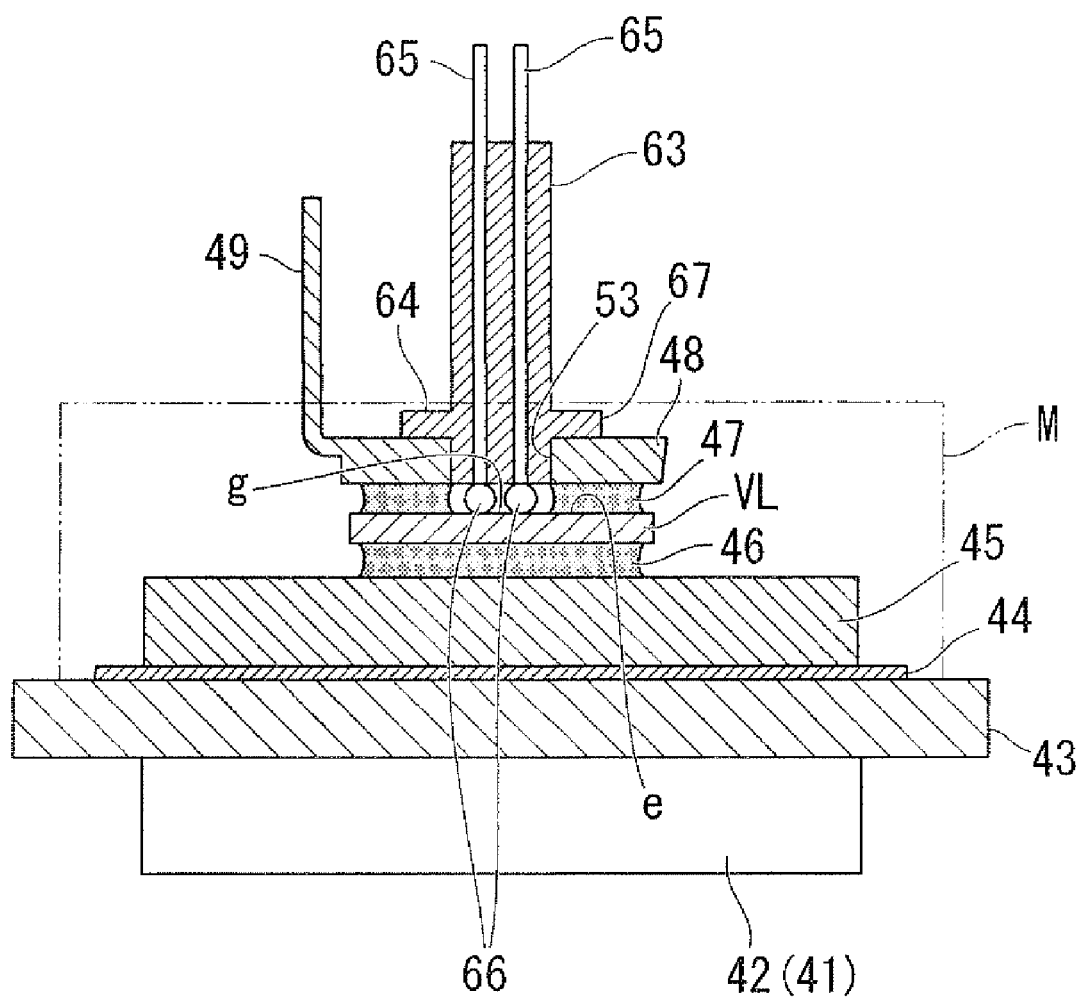
FIG. 14 is a cross-sectional view along line A-A in FIG. 11.

Here, FIG. 11 shows, as an example of a heat sink-integrated power module, the power module 40f of the first inverter 5. FIG. 12 is a cross-sectional view along line A-A in FIG. 11 showing, in exploded form, the arranged portions of one transistor VL of the power module 40f. FIG. 13 is an exploded perspective view of principal portions, and FIG. 14 is a cross-sectional view of the assembled state of FIG. 12.

As shown in FIG. 11 to FIG. 14, the power module 40f includes a heat sink 41 with a plurality of plate-shape fins 42 arranged in one direction in the lower portion. Insulating material 44 including an epoxy resin is applied onto the pedestal 43 of the heat sink 41, and the bus bar 45 serving as a base is placed thereupon. On the upper portion of the bus bar 45 serving as a base is placed the transistor VL through solder 46, and on the transistor VL is stacked the upper bus bar (plate-shape conducting member) 48, which is a plate-shape conducting member, through solder 47. A connecting piece 49 is formed in an erect L-shape on the end of the upper bus bar 48.

In the center of the bus bar 48 is formed a square hole (opening portion, cutout portion) 53. This square hole 53 is formed at a position at which the gate terminal g of the upper face (first face) in the center of the transistor VL is exposed. Also, the upper face of the transistor VL surrounding the gate terminal g is configured as an emitter terminal e connected to the bus bar 48. The lower face (second face) of the transistor VL is the collector terminal c.

A terminal block 63, in which two signal lines 65 are molded with insulating resin material, is inserted into and fixed in the square hole 53. The terminal block 63 includes signal lines 65 and a resin module which supports the signal lines 65. The lower ends of the signal lines 65 exposed at the bottom end of the protruding portion 67 are connected to the gate terminal g of the upper face in the center of the transistor VL by the solder (bonding material) 66.

The terminal block 63 includes a flange portion 64 stacked on the lower bus bar 48 in the lower portion, and a protruding portion 67 protrudes downward is provided in the flange portion 64. The protruding portion 67 mates with the square hole 53 of the bus bar 48, and the insertion of the protruding portion 67 is restricted by the flange portion 64. In other words, the terminal block 63 includes a flange portion 64 and a protruding portion 67, in which the flange portion 64 is supported by the bus bar 48, and the protruding portion 67 is protruded from one face of the flange portion 64. The bus bar 48 includes an opening portion 53 and a supporting portion, in which the opening portion 53 has an opening into which the protruding portion 67 of the terminal block 63 is inserted, and the supporting portion surrounds the opening and supports the flange portion 64. An engaging portion is constructed by the opening portion 53 of the bus bar 48 and the supporting portion, in which the engaging portion engages with a portion of the terminal block 63 and supports the terminal block 63.

The bus bar 45 serving as a base, transistor VL, and upper bus bar 48 are formed into a molded portion M by epoxy resin within a die, in a state in which the connection piece 49 of the upper bus bar 48 is exposed (see the dot-dash line in FIG. 14), and this is mounted in an opening portion 51 of the base frame 50.

By means of the above embodiment, the terminal block 63 is arranged on the bus bar 48 so as to be joined with the square hole 53, so that the signal lines 65 of the terminal block 63 can be directly connected to the gate terminal g of the transistor VH across the square hole 53 of the bus bar 48. Therefore there is no need for a broad occupied area, as in the case of connecting the signal wires 65 with the gate terminal g by wires in wire bonding, so that the overall size can be reduced. In other words, the signal lines 65 of the terminal block 63 is directly connected to the gate terminal g of the transistor VH through the engaging portion of the bus bar 48. Further, because the signal lines 65 are directly connected to the gate terminal g of the transistor VI, there are advantages in that conduction resistance is decreased and electrical losses are reduced.

Further, in this embodiment the signal lines 65 can be connected with the gate terminal g of the transistor VL by merely mating the protruding portion 67 of the terminal block 63 with the square hole 53 of the bus bar 48, thereby the connection task is easily performed. Also, when mating the protruding portion 67 with the square hole 53, the flange portion 64 of the terminal block 63 need merely be pressed against the periphery of the square hole 53, so that the task is simplified.

This invention is not limited to the above-described embodiment, and for example is not limited to hybrid vehicles, but can be applied to the semiconductor modules of electric automobiles. Further, a square hole 53 was described as an example of an opening portion, but a cutout portion may be provided in the bus bar 48, and the terminal block 63 inserted and fixed thereinto.

Below, another embodiment of the present invention is explained. In the following explanation, constituent components similar to those in the above embodiment are assigned the same symbols, and explanations thereof are omitted or simplified.

Figure 15:
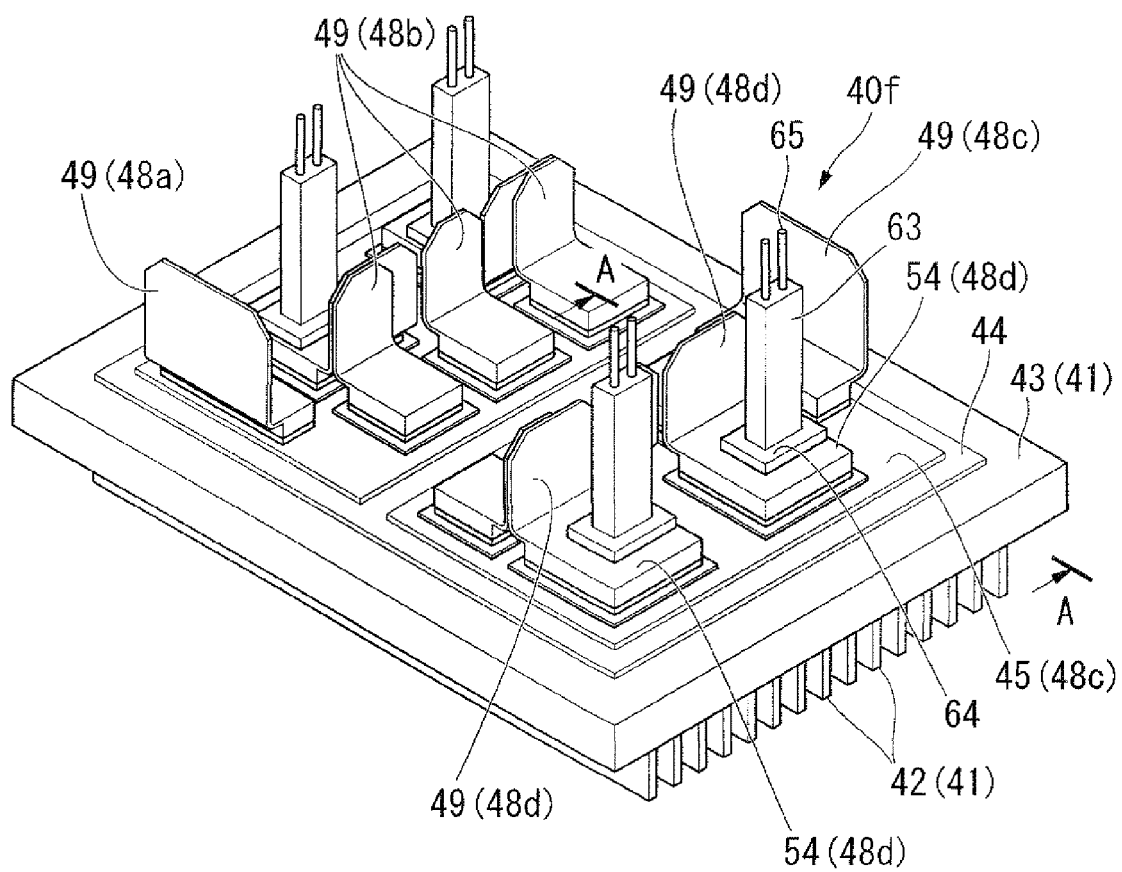
FIG. 15 is a perspective view of a power module.
Figure 16:
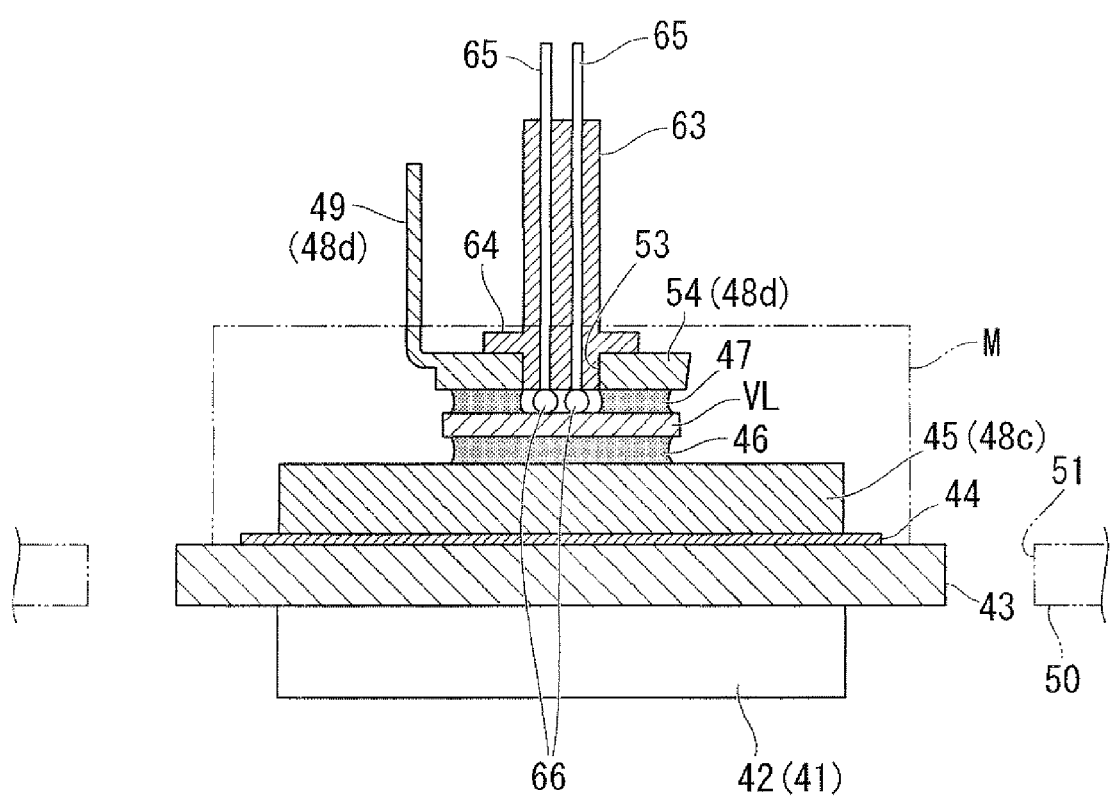
FIG. 16 is a cross-sectional view along line A-A in FIG. 15.

In this embodiment, as shown in FIG. 15 and FIG. 16, the power module 40f includes a heat sink 41 with a plurality of plate-shape fins 42 arranged in one direction in the lower portion. Insulating material 44 including epoxy resin is applied onto the pedestal 43 of the heat sink 41, and the bus bar 45 serving as the base is placed thereupon. On the upper portion of the bus bar 45 serving as the base is placed for example the transistor VL through solder 46, and on the transistor VL is stacked the upper bus bar 54 through solder 47. A connection piece 49 is formed erect (rise) on the end of the upper bus bar 54. The upper corners of the connection piece 49 are chamfered to facilitate insertion into slits TS, YS of bus bar, as explained below.

The bus bar 45 serving as the base, transistor VL, and upper bus bar 54 are formed into a molded portion M by epoxy resin within a die, in a state in which the connection piece 49 of the upper bus bar 54 is exposed, and this is mounted in an opening portion 51 of the base frame 50. Other transistors are arranged on the pedestal 43 of the heat sinks 41 in a similar manner. In FIG. 15 and FIG. 16, all structurally erected connection portions are shown as connection pieces 49, and the numbers of corresponding bus bars in FIG. 1 are indicated in parentheses beside the symbol "49".

That is, to provide a detailed explanation together with FIG. 1, when the power module 40f is taken as an example, the POut bus bar 20 of the high-side transistor VH is the bus bar 48a serving as the power supply bus bar, and the Out bus TrV 23 of the transistor VH is the bus bar 48b serving as an AC output bus bar.

Further, the N bus bar 21 of the low-side transistor VL is the bus bar 48b serving as a ground bus bar, and the Out bus TrV 23 of transistor VL is the bus bar 48c serving as an AC output bus bar. The other power modules 40a to 40e and 40g similarly include bus bars 48a to 48d.

Specifically, the portion on the left in FIG. 15 corresponds to the transistor VH. One connection piece 49 (power supply erect portion) on the front side corresponds to the bus bar 48a forming the power supply bus bar, and this connection piece 49 is connected to the POut bus bar 20 serving as the power supply plate (power supply plate portion) arranged in parallel with the base frame 50. The connection pieces 49 (output erect portion) arranged in the rear correspond to the bus bars 48b forming the AC output bus bars, and this connection piece 49 are connected to the Out bus TrV 23 serving as the output plate arranged in parallel with the base frame 50. The POut bus bar 20 (power supply output plate portion) is substantially parallel to the reference face comprising the arrangement direction of transistors. The Out bus TrV 23 (output plate portion) is also substantially parallel to the reference face.

Further, the portion on the right in FIG. 15 corresponds to the transistor VL. One connection piece 49 (power supply erect portion) in the rear corresponds to the bus bar 48c forming an AC output bus bar, and this connection piece 49 is connected to the Out bus TrV 23 serving as the output plate arranged in parallel with the base frame 50. The two connection pieces (ground erect portion) 49 arranged on the front side correspond to the bus bars 48d forming the ground bus bar, and this connection pieces 49 are connected to the N bus bar 21 serving as the ground plate arranged in parallel with the base frame 50. The N bus 21 (ground plate portion) is substantially parallel to the reference face.

Similarly for the other transistors UH, UL, WH, WL of the first inverter 5, the connection piece 49 of the corresponding bus bar 48a is connected to the POut bus bar 20, the connection pieces 49 of the corresponding bus bars 48b are connected to the Out buses TrU, W 22, 24, the connection pieces 49 of the corresponding bus bars 48c are connected to the Out buses TrU, W 22, 24, and the connection pieces 49 of the corresponding bus bars 48d are connected to the N bus bar 21.

Also for the transistors UH, UL, VH, VL, WH, WL of the second inverter 6, the connection piece 49 of the corresponding bus bar 48a is connected to the POut bus bar 20 common to the first inverter 5, and the connection piece 49 of the corresponding bus bar 48d is connected to the N bus bar 21 common to the first inverter 5. For the bus bars 49b, 49c in the second inverter 6, the erected connection pieces 49 are connected to the respective Out buses GEN (U, V, W) 25, 26, 27.

Here, a square hole 53 is formed in the center of the bus bar 54, and a terminal block 63 formed from an insulating resin material is inserted into this square hole 53, in a state of insertion and restriction by the flange portion 64. The two signal lines 65, 65 are passed through this terminal block 63, and the upper ends of the two signal lines 65, 66 protrude upward from the terminal block 63. Also, the lower ends of the signal lines 65, 65 are connected to the transistor VL by means of solder 66.

Figure 17:
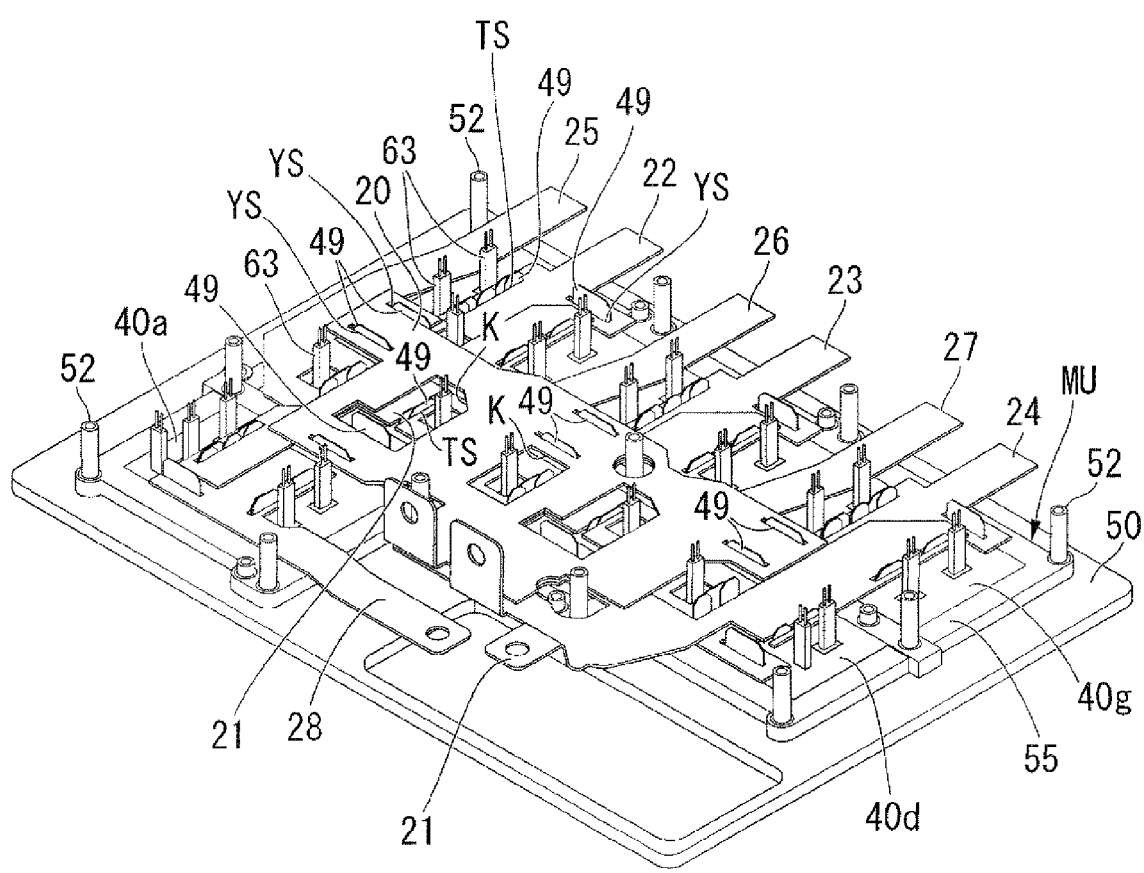
FIG. 17 is a perspective view of a base frame and bus bar.
Figure 18:
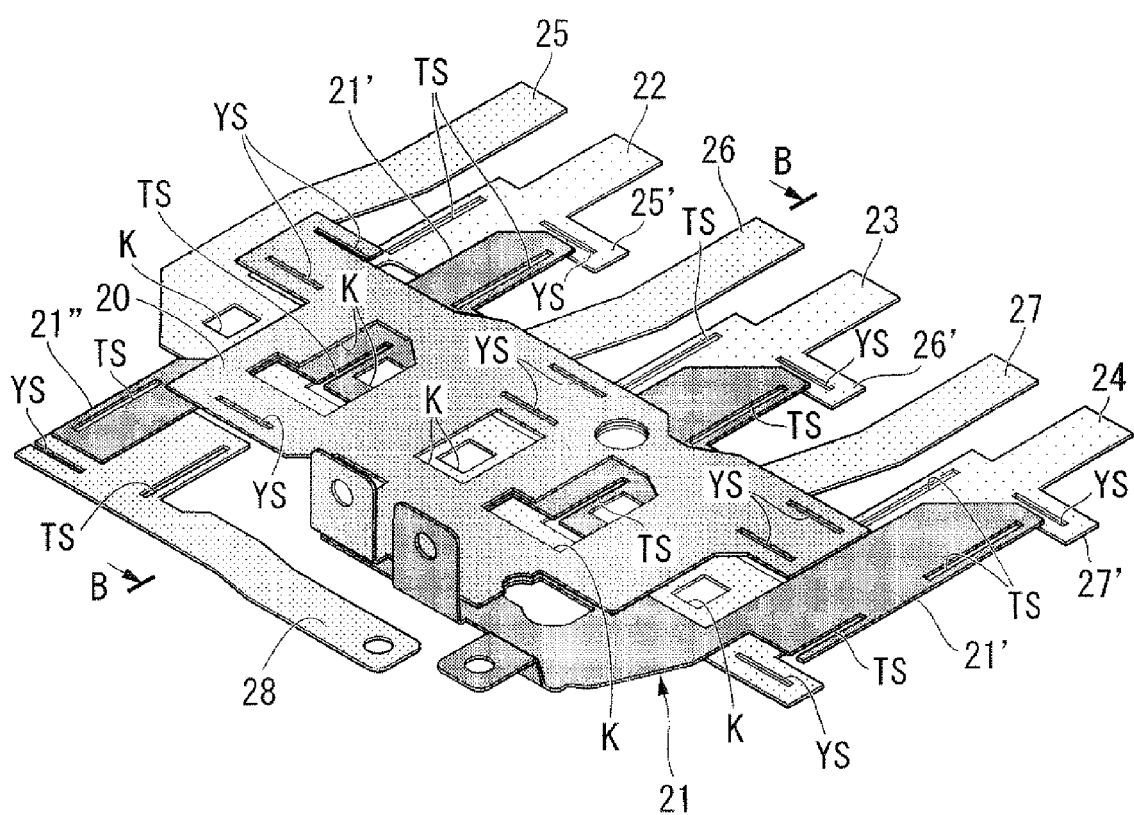
FIG. 18 is a perspective view showing the stacking circumstances of bus bar.

As shown in FIG. 17 and FIG. 18, above the module unit MU, three narrow plate-shape Out buses Tr (U, V, W) 22, 23, 24 and three Out buses GEN (U, V, W) 25, 26, 27 in the lowermost portion are arranged extending in the depth direction of the base frame 50. In plane view, these three Out buses Tr (U, V, W) 22, 23, 24 and three Out buses GEN (U, V, W) 25, 26, 27 are placed in positions corresponding to the power modules 40b to 40d and 40e to 40g respectively, arranged in the width direction of the base frame 50 at substantially equal intervals, in which the interval between the three Out buses Tr (U, V, W) 22, 23, 24 is different with the interval between the three Out buses GEN (U, V, W) 25, 26, 27.

Tongue pieces 25', 26', 27 are formed in front of the tips (on the rear side) of the Out buses Tr (U, V, W) 22, 23, 24, in the width direction of the base frame 50. Slits YS are provided in each of the tongue pieces 25', 26', 27', in the width direction of the base frame 50. Also, slits TS are provided in each of the Out buses Tr (U, V, W) 22, 23, 24, in the depth direction of the base frame 50.

Slits YS are also formed in each of the Out buses GEN (U, V, W) 25, 26, 27 on the base side, in the width direction of the base frame 50. In FIG. 18, only one of the slit YS of the Out buses GEN (U, V, W) 25, 26, 27 is shown.

Above these three Out buses Tr (U, V, W) 22, 23, 24 and three Out buses GEN (U, V, W) 25, 26, 27, the N bus bar 21 is arranged at a prescribed interval.

Three extended pieces 21' are provided on the N bus bar 21, and slits TS, TS are formed in each of the extended pieces 21' in the depth direction of the base frame 50 at positions corresponding to the first inverter 5 and second inverter 6. One extended piece 21" are provided on the front side of the N bus bar 21 in the depth direction of the base frame 50, and slit TS is formed in the extended piece 21" at position corresponding to the converter 7.

Above the N bus bar 21, the POut bus bar 20 is arranged at a prescribed interval. Slits YS are formed in the width direction of the base frame 50 at seven places in the POut bus bar 20.

The PIN bus bar 28 is arranged independently above the power module 40a, and formed in an L shape. A slit YS in the width direction of the base frame 50 and a slit TS extending in the depth direction of the base frame 50 are formed at the position corresponding to the converter 7.

Here, the connecting pieces 49 of the bus bars 48b, 48c shown in FIG. 16 are inserted from below and connected to the slits TS, YS.

Openings K are formed at prescribed positions in the Out buses Tr (U, V, W) 22, 23, 24, N bus bar 21, and POut bus bar 20, in order to cause protrusion of the terminal block 63 of the signal lines 65.

To explain a portion of the connection portions in FIG. 17 in more detail, the connection pieces 49 of each of the power modules are inserted into, connected with, and fixed to the six slits YS on the rear side of the POut bus bar 20, and connection portions of the Out buses Tr (U, V, W) 22, 23, 24 on the side of the first inverter 5 and of the Out buses GEN (U, V, W) 25, 26, 27 on the side of the second inverter 6 are formed so as to be adjacent for each phase.

The connection piece 49 of the power module 40e is inserted into, connected with, and fixed to the slit TS on the tip side of the extended piece 21' of the N bus bar 21 corresponding to the power module 40e, and the connection portion of the Out bus TrU 22 is formed.

The connection piece 49 of the power module 40b is inserted into, connected with, and fixed to the slit TS on the front side of the extended piece 21' of the N bus bar 21 corresponding to the power module 40b, and the connection portion of the Out bus GENU 25 is formed. This connection portion is exposed at the opening K of the POut bus bar 20.

Figure 19:
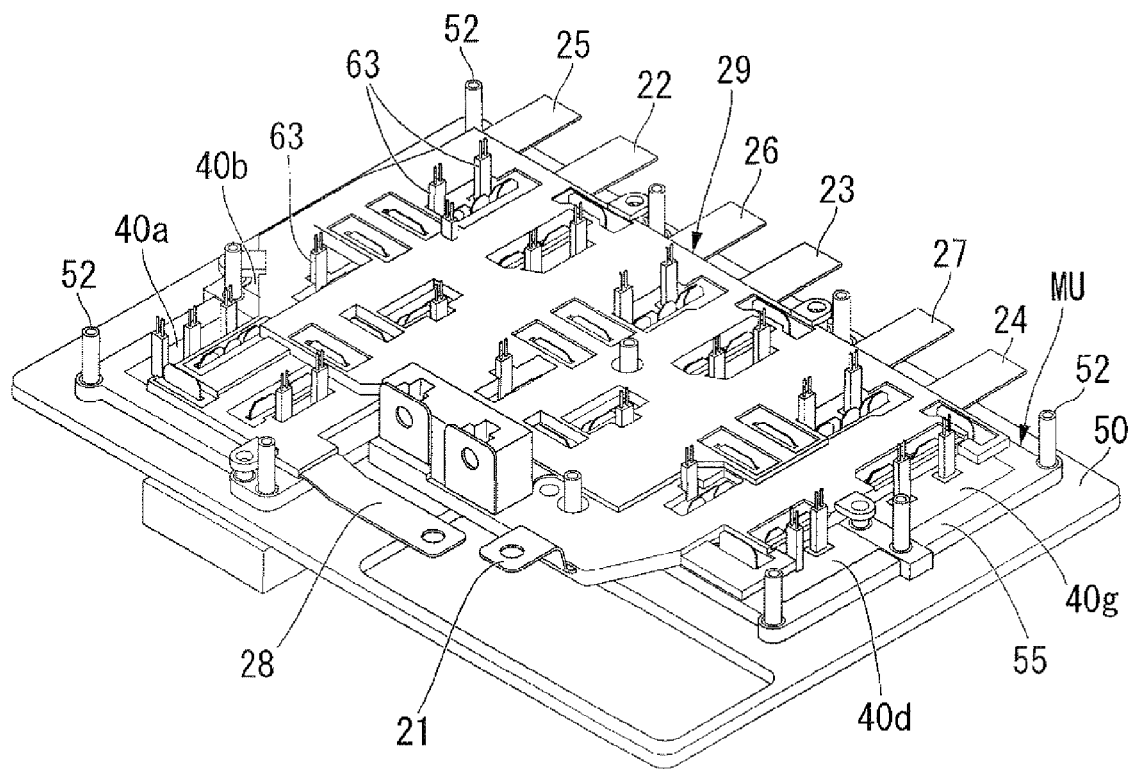
FIG. 19 is a perspective view of a base frame and bus bar plate component.

As shown in FIG. 19, the portion excluding the tip portions of the three Out buses Tr (U, V, W) 22, 23, 24 and the three Out buses GEN (U, V, W) 25, 26, 27, in a state of adjacent overlapping with gaps, the N bus bar 21, PIN bus bar 28, and POut bus bar 20 are resin-molded with resin material intervening and integrated to form the bus bar plate component 29. In this state, the tip portions of the three Out buses Tr (U, V, W) 22, 23, 24 and the three Out buses GEN (U, V, W) 25, 26, 27 are not molded, and are exposed to the outside.

Here, the terminal block 63 with signal lines 65 protruding from the power modules 40a to 40g is extended upward from the opening K (see FIG. 18) of the Out buses Tr (U, V, W) 22, 23, 24, the N bus bar 21, the POut bus bar 20, and the N bus bar 21 as necessary, and protrudes from the upper face of the bus bar plate component 29.

Figure 20:
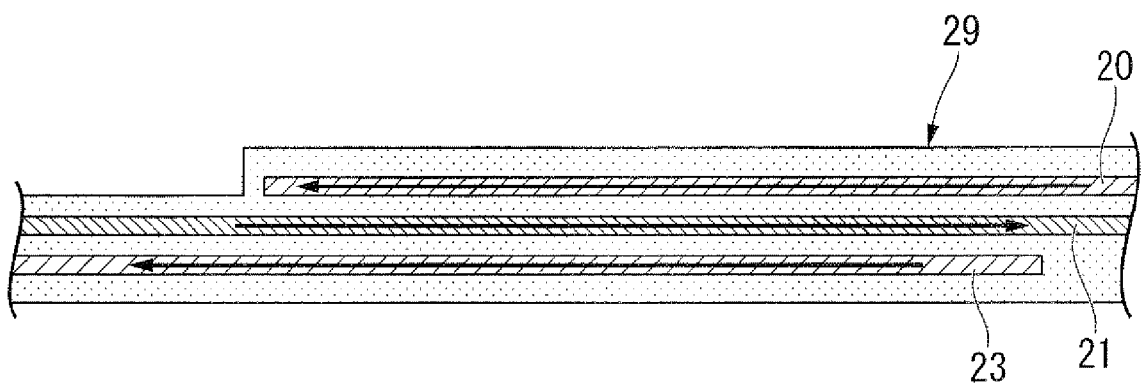
FIG. 20 is a cross-sectional view along line B-B in FIG. 18.

Hence, as shown in the cross-sectional view of FIG. 20 along line B-B in FIG. 18, in the lower portion of the integrated bus bar plate component 29, the N bus bar 21 is arranged above the Out bus TrV 23, and the POut bus bar 20 is arranged above the N bus bar 21. So that, for example, while driving the motor 4, when a current flows to the left in the POut bus bar 20 as the outward path of the current path, current flows to the right in the N bus bar 21 as the homeward path of the current path, and current also flows to the left in the Out bus TrV 23.

By means of the above embodiment, the connection pieces 49 of the bus bar 48a, bus bars 48b and 48c, and the bus bar 48d which are form current paths are connected by a single plate which consists of the POut bus bar 20, either one of the Out buses Tr (U, V, W) 22, 23, 24 and Out buses GEN (U, V, W) 25, 26, 27, and the N bus bar 21; in which the connection pieces 49 rise from the transistors UH, UL, VH, VL, WH, WL which are the switching elements of the first inverter 5 and second inverter 6. So that the number of electrical contact points and the number of components can be reduced, and the electrical resistance and conduction losses can be reduced by shortening the current paths.

Further, because the POut bus bar 20, either one of the Out buses Tr (U, V, W) 22, 23, 24 and the Out buses GEN (U, V, W) 25, 26, 27, and the N bus bar 21 have a stacked structure, the thickness of the bus bar plate component 29 in which these are combined and molded with resin can be suppressed, and the entirety can be formed compactly. In addition the connection distance with adjacent components can be shortened, and inductances can be reduced.

Also, at least the POut bus bar 20 and N bus bar 21, which are related as the outward path and homeward path of the current path, are stacked adjacently, therefore the reduction effect of the inductance can be maximized by the mutual inductance which counteracts the magnetic fluxes by the oppositely-directed magnetic fields arising from these oppositely-directed currents flows in the POut bus bar 20 and N bus bar 21. In addition, a reduction of surge voltages and switching losses can be attained. Hence, when applied to hybrid vehicles, in which currents quantities (capacities) are large, a significant reduction effect of the inductance can be obtained.

When the unit of the present invention is applied to a hybrid vehicle, the connection pieces 49 of the bus bars 48a and the bus bar 48d, which are rose from the transistors UH, UL, VH, VL, WH, WL of the first inverter 5 and second inverter 6, are connected and conducted with the common POut bus bar 20 and N bus bar 21 via the positive-electrode side terminal Pt and negative-electrode side terminal Nt. Thereby the space occupied on the base frame 50 can be reduced, and therefore the entirety of the unit can be decreased in size and mountability can be improved. Further, because the size can be decreased, a larger peripheral component mounting space can be secured.

This invention is not limited to the above-described embodiments, and for example is not limited to hybrid vehicles, but can be applied to the power control units of electric automobiles.

Further, an example was described in which the N bus bar 21 was arranged above the Out bus TrV 23, and the POut bus bar 20 was arranged the N bus bar 21. However, if the arrangement is such that the current flows oppositely in the POut bus bar 20 and in the N bus bar 21, which are the outward path and homeward path of the current path, then the arrangement of the POut bus bar 20 and the N bus bar 21 may be interchanged, and a structure can also be adopted in which the Out bus TrV 23 is arranged between the POut bus bar 20 and the N bus bar 21, although the POut bus bar 20 and N bus bar 21 are separated slightly as a result.

A aspect of the present invention is a power control unit which comprises a power module having a power supply bus bar; a plurality of high-potential side semiconductor elements having a first side of electrode and a second side of electrode, the first side of electrode fixed to the power supply bus bar; a plurality of AC output bus bars connected with the second side of electrode of each of the high-potential side semiconductor elements separately; a plurality of low-potential side semiconductor elements having a third side of electrode and a fourth side of electrode, the third side of electrode fixed to each of the AC output bus bars; and a ground bus bar connected with the fourth side of electrode of each of said low-potential side semiconductor elements, wherein, the high-potential side semiconductor elements and low-potential side semiconductor elements further comprise a collector terminal, an emitter terminal, and a gate terminal, the collector terminal or the emitter terminal and the gate terminal provided on one side of the high-potential side semiconductor elements and low-potential side semiconductor elements; the power module further has a plate-shape conducting member; the plate-shape conducting member has a cutout portion so as to expose the gate terminal; the power module further has a terminal block, the terminal block being formed by resin molding signal lines connected and conducted with the gate terminal; and the terminal block is arranged in the plate-shape conducting member so as to engage with the cutout portion.

In one example of this aspect, the cutout portion is an opening portion provided in the plate-shape conducting member, and the terminal block has a flange portion stacked on the plate-shape conducting member and a protruding portion protruding from the flange portion and exposing the signal lines to the surface of the terminal block; the protruding portion mates with the opening portion, to connect and conduct the gate terminals with the signal lines.

Further, in one example of this aspect, the end portions of the power supply bus bar, the AC output bus bars, and the ground bus bar are rose; the end portions of each of the bus bars are respectively connect and conduct with a power supply plate, a output plate, and a ground plate which are arranged in parallel with a base; and the power supply plate, output plate, and ground plate are stacked with an insulating material therebetween.

In one example of this aspect, the power supply plate and the ground plate are stacked adjacently.

Another aspect of the present invention provides a hybrid vehicle which comprises an engine; an electric generator driven by the mechanical output of the engine; a battery charged by an electrical output of the electric generator; a motor driven by at least one of a discharge output of the battery and the electrical output; and a power control unit according to aspect described above, in which a power module has a first power module which controls the motor and a second power module which controls the electric generator, wherein the first power module and the second power module are arranged on a same base; and a power supply bus bar and a ground bus bar, which are rose from the first power module and second power module, are connected and conducted with a common power supply plate and a common ground plate.

By means of one example of the present invention, because the plate-shape conducting member is arranged so that the terminal block connects with the cutout portion, the signal lines of the terminal block can be directly connected with the gate terminals of the semiconductor elements across the cutout portion of the plate-shape conducting member. Therefore there is no longer a need for a wide occupied areas, as in cases in which the two are connected by wires in wire bonding, and the entirety of the unit can be made smaller, and moreover direct connection is possible, so that the conduction resistance can be reduced, and there is an advantageous result in that electrical losses can be reduced.

Further, by means of one example of the present invention, the signal lines and the gate terminals can be connected merely by mating the opening portion of the plate-shape conducting member with the protruding portion of the terminal block, so that there is an advantageous result in that the task is easily performed. Also, in mating of the protruding portion, it is sufficient that the flange portion of the terminal block be pressed against the periphery of the opening portion, so that there is an advantageous in result that the task can be simplified.

Further, by means of one example of the present invention, the rising end portions of the power supply bus bar, AC output bus bars, and ground bus bar are connected by single plate which consists of the power supply plate, output plates, and ground plate. Therefore there are advantageous results in that the number of electrical contact points and the number of components can be reduced. Also, by shortening current paths, the electrical resistance and conduction losses can be reduced.

Further, because the power supply plate, output plates, and ground plate have a stacked structure, there are advantageous results in that the thickness of a unit which combines these can be reduced, and the distance from components adjacent to this plate can also be shortened, so that the inductance can be further reduced.

Further, by means of one example of the present invention, at least the power supply plate and the ground plate, which are related as the homeward path and outward path of the current path, are stacked adjacently, therefore the reduction effect of the inductance can be maximized by the mutual inductance which counteracts the magnetic fluxes by oppositely-directed magnetic fields arising from the oppositely-directed currents, and there is an advantageous result in that surge voltages and switching losses can be reduced.

Further, by means of one example of the present invention, power supply bus bars and ground bus bar rising from a first power module and a second power module, are connected and conducted to a common power supply plate and ground plate. Therefore the space occupied on the base can be reduced, and so there is advantageous result in that the entirety of the unit can be made small and mountability can be improved. Further, because the size can be reduced, there is advantageous result in that a larger peripheral component mounting space can be secured.

While embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A power control unit comprising:
    a plurality of semiconductor elements including a plurality of high-potential side semiconductor elements and a plurality of low-potential side semiconductor elements, and each having a first face and a second face, a collector terminal or an emitter terminal provided on the first face, or an emitter terminal and a gate terminal provided on the first face;
    a plurality of bus bars electrically connected with at least one of the semiconductor elements, and forming a power module together with the semiconductor elements;
    a terminal block having signal lines and a resin mold which supports the signal lines; and
    an engaging portion provided on at least one of the bus bars, and engaging with a portion of the terminal block, and also supporting the terminal block, the signal lines of the terminal block directly connected with the gate terminals of the semiconductor elements through the engaging portion.

2. The power control unit according to claim 1, wherein the terminal block has a flange portion and a protruding portion, in which the flange portion is supported by the bus bars, and the protruding portion is protruded from one face of the flange portion;
    the engaging portion has an opening portion and a supporting portion, in which the opening portion has an opening into which the protruding portion of the terminal block is inserted, and the supporting portion surrounds the opening and supports the flange portion.

3. The power control unit according to claim 1, wherein the bus bars further have:
    a power supply bus bar electrically connected with the first face of each of the high-potential side semiconductor elements;
    a plurality of AC output bus bars electrically connected with the second face of the high-potential side semiconductor elements respectively, and electrically connected with the first face of the low-potential side semiconductor elements respectively; and
    a ground bus bar electrically connected with the second face of each of the low-potential side semiconductor elements respectively,
    wherein the power supply bus bar has a power supply plate portion and a power supply erect portion, in which the power supply plate portion is substantially parallel to a reference face comprising the arrangement direction of the semiconductor elements, and the power supply erect portion along a direction intersecting the reference face;
    the AC output bus bars have an output plate portion which is substantially parallel to the reference face and an output erect portion along a direction intersecting the reference face;
    the ground bus bar has a ground plate portion which is substantially parallel to the reference face and a ground erect portion along a direction intersecting the reference face; and
    the power supply plate portion, the output plate portions, and the ground plate portion are stacked together with an insulating material therebetween.

4. The power control unit according to claim 3, wherein the power supply plate portion and the ground plate portion are mutually adjacent.

5. A hybrid vehicle comprising:
    an engine;
    an electric generator driven by a mechanical output of the engine;
    a battery charged by an electrical output of the electric generator;
    a motor driven by at least one of a discharge output of the battery and the electrical output; and
    a power control unit according to claim 1,
    wherein a power module has a first power module which controls the motor and a second power module which controls the electric generator;
    the first power module and the second power module are arranged on the same base; and
    the first power module and the second power module have in common at least one of the power supply plate and the ground plate.

* * * * *